United States Patent [19]

Jones et al.

[11] Patent Number: 5,026,575
[45] Date of Patent: Jun. 25, 1991

[54] GROWTH OF POLYCRYSTALLINE $CAF_2$ VIA LOW TEMPERATURE OMCVD

[75] Inventors: Richard A. Jones; Alan H. Cowley; Al F. Tasch, Jr., all of Austin, Tex.

[73] Assignee: Board of Regents, The University of Texas System, Austin, Tex.

[21] Appl. No.: 379,016

[22] Filed: Jul. 11, 1989

[51] Int. Cl.$^5$ .................. C23C 16/30; C23C 16/46
[52] U.S. Cl. ................................ 427/255; 427/255; 427/255.2
[58] Field of Search ............... 427/255, 255.2, 255.1; 423/497, 490; 156/613, 614

[56] References Cited
FOREIGN PATENT DOCUMENTS 61-117503  6/1986  Japan ........................ 427/255.2

OTHER PUBLICATIONS

Schowalter et al., J. Vac. Sci. Technol., vol. A 4 (1986) 1026–1032.
Burns et al., J. Organomet. Chem., vol. 325 (1987) 31–37.
Benac et al., Chemistry of Materials, vol. 1 (1989) 289–290.

*Primary Examiner*—Norman Morgenstern
*Assistant Examiner*—Margaret Bueker
*Attorney, Agent, or Firm*—Arnold, White & Durkee

[57] ABSTRACT

The present invention involves the use of organocalcium precursors for the chemical vapor deposition of thin $CaF_2$ films under exceptionally mild conditions. This method is based on utilizing an organocalcium compound and a source of fluorine in a chemical vapor deposition reaction to form $CaF_2$.

29 Claims, No Drawings

GROWTH OF POLYCRYSTALLINE CAF2 VIA LOW TEMPERATURE OMCVD

Research relating to the development of the present invention was partially supported by Contract No. N00014-87-K-0323 from the U.S. Office of Naval Research.

BACKGROUND

The present invention relates to a method for manufacturing a silicon-on-insulator ("SOI") structure based on a layer of calcium fluoride ($CaF_2$) as the insulator.

The development of SOI material structures are of considerable interest in integrated circuit technology because successful development of such structures will allow fabrication of three-dimensional integrated circuits. Additionally, SOI material structures will allow fabrication of memory and logic circuits that are immune to both soft errors due to alpha particles and single particle upset events caused by high-energy particles (1).

SOI structures are being pursued as a technique to isolate each device in a chip on its own silicon mesa, which would sit on top of an insulating layer. As a result, less chip area would be required than the present isolation techniques in standard silicon technology. "Latch up" would be eliminated and stray captive coupling would also be reduced. Currently, most research and development activity in SOI focuses on the use of a layer of amorphous $SiO_2$ with the thickness of 1500–5000 Å as the insulator because of the excellent properties of $SiO_2$ and its excellent compatibility with silicon. The single crystal layer of silicon over the $SiO_2$ is formed generally by two main techniques involving recrystalizing amorphous or polycrystaline silicon from seed locations in the underlying silicon substrate, or implanting a very high dose, approximately $10^{18}$ ions/cm, ion implantation of oxygen, to form an amorphous $SiO_2$ layer below the surface of silicon substrate.

Although prior techniques have met with moderate success, difficulty exists in obtaining low defect density, high-quality single crystal silicon on amorphous $SiO_2$ layers. An alternative approach to the formation of the SOI structure is utilizing a single-crystal, lattice-matched insulator, which allows the possibility for growth of a single crystal overlying silicon layer directly on the insulator.

Calcium fluoride ($CaF_2$) is optimal for fabricating SOI because of its wide band gap and a cubic structure similar to that of silicon. $CaF_2$ is lattice matched to silicon to within 0.6% at room temperature.

SOI insulators based on $CaF_2$ have been demonstrated using molecular beam epitaxy (MBE) (2), but more work is needed to achieve high electrical quality SOI structures and interfaces, and topographically smooth layers of uniform thickness. Using MBE, $CaF_2$ is grown using $CaF_2$, evaporated from tungsten or graphite crucibles at very high temperatures (1200–1400° C.) onto silicon substrates at temperatures from 550–700° C. (3,4).

Chemical vapor deposition ("CVD") was used in some of the earlier efforts to grow silicon insulator (SI) on insulating substrates, including $CaF_2$. However, the gases involved in the CVD process were subject to a growth temperature of about 1100° C. Additionally, the gases reacted with the $CaF_2$ substrate, resulting in poor epitaxy.

One key requirement for the success of the present approach has been to identify and develop appropriate volatile organometallic precursors and CVD reations which will produce $CaF_2$. Unlike other well documented organometallic chemical vapor deposition (OMCVD) processes such as those employed for the fabrication of thin films of III/V compound semiconducts (5) there appear to be no previous reports of CVD growth of $CaF_2$. This may be due to the lack of suitable volatile calcium compounds (6).

SUMMARY OF THE INVENTION

One object of the present invention is to provide an improved method for fabricating a SOI structure utilizing $CaF_2$ as the insulator. This improved method should, because lower temperatures are utilized, help prevent the problems of layer mixing, wafer warpage, and film stresses associated with high temperature depositions. This improved method is based on an organometallic chemical vapor deposition (OMCVD) reaction to form $CaF_2$. The chemical vapor deposition of $CaF_2$ on a substrate is accomplished by placing an organocalcium compound and a gas which is a source of fluorine in a reactor which allows gases ready access to the substrate. Next, the reactor is heated until $CaF_2$ appears on the substrate.

The present invention involves a method for deposition of $CaF_2$ on a substrate, the substrate being preferably silicon. This method comprises the following steps. Initially a sealable system is prepared which includes a reactor with a heatable portion and a substrate. An organocalcium compound is placed in the reactor and a gas which is a source of fluorine is fed into the system. After sealing the system, the reactor is heated until the substrate is coated with calcium fluoride. The reactor preferably has an organocalcium compound-containing portion which may be heated. The substrate is in part of the system in communication with the heatable portion so that vaporized organocalcium compound and fluorine-containing gas have access to the substrate.

A preferred organocalcium compound is bis-pentamethylcyclopentadienyl calcium and a preferred gas which is a source of fluorine is $SiF_4$ or $NF_3$. For the introduction of the gas which is a source of fluorine, the placing step preferably involves a reduction of pressure in the system to at least about $10^{-2}$ Torr before introduction of the said gas. The gas which is a source of fluorine is preferably added until pressure inside the system reaches about 10 Torr.

The heating step generally involves heating the reactor to a temperature between about 100° C. and about 550° C., preferably between about 200° C. and about 400° C., more preferably between about 150° C. and about 200° C. and most preferably about 150° C. These variations in temperature most usually relate to the vaporization temperatures of the volatile organocalcium compound being used although they may also be varied to control the rate of vaporization and $CaF_2$ deposition on the substrate. A preferred reactor for this system is a vertical or horizontal hotwall glass reactor containing a substrate, which allows gaseous substances to contact the substrate. In the above-described heating step the reactor preferably has a lower portion which contains the organocalcium compound and is heated, preferably for at least about one hour, which allows formation of adequate amounts of $CaF_2$ on the substrate surface.

In a particularly detailed embodiment, the method of the present invention for preparing a silicon substrate coated with CaF$_2$ may be described as comprising the following steps: (1) preparing or otherwise obtaining an organocalcium compound; (2) preparing or otherwise obtaining a gas which is a source of fluorine; (3) placing the organocalcium compound in a heatable portion of a reactor and introducing the gas which is a source of fluorine into the reactor system, said reactor system containing a second portion comprising the substrate; (4) sealing the reactor system; (5) heating the heatable portion of the reactor until said substrate is coated with CaF$_2$; and (5) removing coated silicon substrate from the reactor.

DESCRIPTION OF THE PREFERRED EMBODIMENTS

These theories are presented as illucidating and are not meant to represent limitations of the invention unless otherwise specifically indicated herein.

"Me" is used to represent a methyl group. The term "in communication" is defined as a mechanism that will allow liberated gases from a reactor ready access to a substrate.

Some features of the present invention are: (1) the first chemical vapor deposition (CVD) of CaF$_2$ from volatile precursors and (2) ultra low temperature formation of thin film (polycrystalline) CaF$_2$ using this technique. CaF$_2$ is an excellent choice for the insulator in SOI structures because of its wide band gap and its lattice matching to silicon within 0.6%.

The present invention involves the use of organocalcium precursors for the chemical vapor deposition of thin CaF$_2$ films under exceptionally mild conditions. This method is based on utilizing an organocalcium chemical vapor deposition reaction to form CaF$_2$.

Earlier work on organocalcium chemistry focused on utilizing small ligands such as methyl and ethyl. The lack of steric saturation often resulted in intractable oligomeric materials or decomposition products. The use of bulkier groups results in isolation of stable organocalcium derivatives.

Bis(cyclopentadienyl) calcium is polymeric in the solid state, but the volatile organometallic derivative bispentamethylcyclopentadienyl calcium (C$_5$Me$_5$)$_2$Ca is monomeric and may be sublimed at 75° C. and 1x10$^{-3}$ Torr pressure. This compound was recently reported by Burns et al. (7). The present invention involves low temperature CVD of CaF$_2$ using bis-pentamethylcyclopentadienyl calcium with either SiF$_4$ or NF$_3$ as the source of fluorine. The overall process involves the reaction of a volatile organometallic source of calcium with a gaseous source of fluorine.

The overall reaction stochiometries appear to be:

(C$_5$Me$_5$)$_2$ Ca+2SiF$_4$→CaF$_2$+2C$_5$Me$_5$SiF$_3$ or (C$_2$Me$_5$)$_2$ Ca+2NF$_3$→CaF$_2$+2C$_5$Me$_5$NF$_2$

This is the first chemical vapor depositions of calcium fluoride (CaF$_2$) from volatile precursors at ultra low temperatures in the formation of thin film calcium fluoride. The temperature in Example I is, for example, 150° C. In comparison, calcium fluoride has been previously used in MBE growth by evaporation of calcium fluoride CaF$_2$ from tungsten or graphite crucibles at high temperatures of 1200–1400° C. The lower temperature of 150° C. in Example I is desirable to prevent difficulties such as layer mixing, wafer warpage and film stresses that plague high temperature depositions. The growth of polycrystaline calcium fluoride CaF$_2$ at 150° C. is a remarkably low temperature for the growth of calcium fluoride, compared to other techniques.

NaC$_5$Me$_5$ is made from pentamethylcyclopentadiene by the reaction of Na (dispersion) with pentamethylcyclopentadiene in THF. Pentamethylcyclopentadiene can be obtained from the Aldrich Chemical Company, Milwaukee, Wisconsin.

Bis-pentamethylcyclopentadienyl calcium is prepared from CaI$_2$ and NaC$_5$Me$_5$ by the reactions:

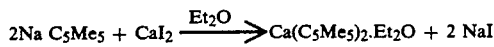

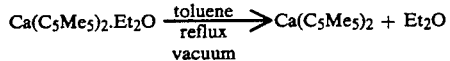

EXAMPLE I

A vertical hot-wall glass reactor was connected to a vacuum manifold which permits the introduction of SiF$_4$ or NF$_3$. The organometallic calcium compound was placed in the lower portion of the tube. The system was then evacuated to about 10$^{-2}$ Torr. SiF$_4$ was added until the pressure reached 10 Torr. The system was sealed and partially submerged in an oil bath maintained at 150° C. After one hour, white polycrystalline deposits were observed on the walls of the vessel in the region immediately above the oil level.

Polycrystalline deposition may be obtained under similar conditions on glass and Si(100). Growth rates and film thicknesses appear to be influenced by the distance of the Cp*$_2$Ca from the reaction regime in the reactor. Thus, thicknesses varying from 10 to 100$\mu$m can be observed. These correspond to very approximate growth rates of 10 to 100 $\mu$m h$^{-1}$. There appeared to be little difference in the film properties when grown on glass or silicon substrates or when using either SiF$_4$ or NF$_3$. X-ray powder diffraction patterns matched the JCPDS data and confirmed that the deposits were polycrystalline CaF$_2$.[8] Nomarsky optical microscopy confirmed the polycrystalline nature of the product. The size of the crystallites appeared to range from 20 to 50 $\mu$m. XPS data were obtained on various samples which were etched twice with ionized argon at 5 minute intervals.[9] The corrected Ca 2p and F 1s signals at 347.7 and 684.6 eV respectively compared well with the literature values (347–348, 689.6 eV), and confirm the Ca:F ratio of 1:2. XPS analysis also revealed the presence of considerable quantities of carbon (18%) and oxygen (7%) in the films. This is not altogether unexpected since no particular precautions were taken in handling the samples. The high carbon levels may also be due to organic fragments which remain in the deposited material.

Furthermore, although the CaF$_2$ produced by the method was polycrystalline in nature, it is believed that this is a major step toward the goal of low temperature growth of epitaxial CaF$_2$ on silicon, using the method of the present invention.

The following literature references in pertinent part are incorporated by reference herein for the reasons cited.

REFERENCES (1) Lam, et al., *VLSI Electronics Microstructure Science* 1982, 4, 1.

(2) Schowalter, et al., *J. Vac. Sci. Technol.* 1986, A4, 1026.
(3) Schowalter, et al., *J. Appl. Phys.* 1985, 58, 302.
(4) Reichelt, et al., *J. Vac. Sci. Technol.* 1973, 10, 1153.
(5) Ludowise, *J. Appl. Phys.*, 1985, 58, 231.
(6) Lindsell, *Comprehensive Organometallic Chemistry* 1982, Wilkinson, G.; Stone, F. G. A.; Abel, E. W., Eds, Vol. 1, Pergamon Press.
(7) Burns, et al., *J. Organomet. Chem.* 1987, 325, 31 and references therein.
(8) Joint Committee for Powder Diffraction Standards (JCPDS), International Center for Diffraction Data, 1601 Park Lane, Swarthmore, PA 19081, Card No. 35-816, 1988.
(9) XPS data were obtained on a VG Scientific Escalab Mark II with a Mg(K-α)X-ray anode. The observed binding energies [Ca 2P (354.1leV),F ls (691.0eV)] were corrected for electrostatic charging. Literature values were obtained from "The Handbook of X-ray Photoelectron Spectroscopy", Wagner, C. D.; Riggs, W. M.; Davis, L. E.; Moulder, J. F. Muilenberg, G. E. G. E. (eds) Perkin-Elmer, Physical Electronics Division, 1976.

Changes may be made in the particular organocalcium compounds, gaseous sources of fluorine, temperatures and pressure or in the steps of the method described herein without departing from the concept or scope of the invention as defined in the following claims.

What is claimed is:

1. A method for chemical vapor deposition of $CaF_2$ on a silicon substrate comprising:
    placing an organocalcium compound in a reactor that is in communication with a silicon substrate;
    introducing a gas which is a source of fluorine into the reactor; and
    heating the reactor until $CaF_2$ appears on the silicon substrate.

2. The method of claim 1 wherein the organocalcium compound is volatile at a temperature of less than 550° C.

3. The method of claim 1 wherein the organocalcium compound is bis-pentamethylcyclopentadienyl calcium.

4. The method of claim 1 wherein the gas which is a source of fluorine is $SiF_4$ or $NF_3$.

5. The method of claim 1 wherein the introducing step involves reducing the pressure in the reactor to about $10^{-2}$ Torr before introducing the gas which is a source of fluorine, and by introducing the said gas such that the pressure inside the reactor reaches about 10 Torr.

6. The method of claim 1 wherein, the heating step is further defined as heating the reactor to a temperature between about 100° C. and about 550° C.

7. The method of claim 1 wherein, the heating step is further defined as heating the reactor to a temperature between about 200° C. and about 400° C.

8. The method of claim 1 wherein, the heating step is further defined as heating the reactor to a temperature between about 125° C. and about 200° C.

9. The method of claim 1 wherein, the heating step is further defined as heating the reactor to about 150° C.

10. The method of claim 1 wherein, the reactor is a vertical hotwall glass reactor.

11. The method of claim 1 wherein, the reactor is a horizontal hot wall reactor.

12. The method of claim 1 wherein the reactor comprises an organocalcium compound-containing portion and the heating step is further defined as heating said organocalcium compound-containing portion.

13. The method of claim 1 wherein, the heating step is further defined as being for at least about one hour.

14. A method for deposition of $CaF_2$ on a silicon substrate comprising:
    preparing a sealable system comprising a reactor with a heatable portion and a silicon substrate;
    placing an organocalcium compound in the heatable portion of the reactor;
    introducing a gas which is a source of fluorine into the system;
    sealing the system; and
    heating the heatable portion of the reactor until the silicon substrate is coated with calcium fluoride.

15. The method of claim 14 wherein the organocalcium compound is volatile at a temperature of less than 550° C.

16. The method of claim 14 wherein the organocalcium compound is bis-pentamethylcyclopentadienyl calcium.

17. The method of claim 14 wherein the gas which is a source of fluorine is $SiF_4$ or $NF_3$.

18. The method of claim 14, the introducing step being further defined as involving a reduction of pressure in the system to at least about $10^{-2}$ Torr before introduction of the gas which is a source of fluorine, and by introducing the gas until pressure inside the system reaches about 10 Torr.

19. The method of claim 14 wherein the heating step is further defined as heating the reactor to a temperature between about 100° C. and about 550° C.

20. The method of claim 14 wherein the heating step is further defined as heating the reactor to a temperature between about 125° C. and about 200° C.

21. The method of claim 14 wherein the heating step is further defined as heating the reactor to a temperature between about 200° C. and about 400° C.

22. The method of claim 14 wherein the heating step is further defined as heating the reactor to a temperature of about 150° C.

23. The method of claim 14 wherein the reactor is a vertical hotwall glass reactor arranged to be in communication with a silicon substrate, allowing gaseous substances liberated in said reactor to contact the silicon substrate.

24. The method of claim 14 wherein the reactor is a horizontal hotwall glass reactor arranged to be in communication with a silicon substrate, allowing gaseous substances liberated in said reactor to contact the silicon substrate.

25. The method of claim 14 wherein the reactor is further defined as having a heatable portion to contain the organocalcium compound and this portion of the reactor is heated.

26. The method of claim 14 wherein the heating step is further defined as extending for at least about one hour.

27. A method for preparing a silicon substrate coated with $CaF_2$, the method comprising:
    preparing an organocalcium compound, said compound volatilizing at a temperature of less than 550° C.;
    placing the organocalcium compound in a heatable portion of a reactor;
    introducing a gas which is a source of fluorine into the reactor, said reactor defined further as comprising a second portion containing a silicon substrate;

sealing the reactor;
heating the heatable portion of the reactor to between 100° C. and 550° C. until said silicon substrate is coated with $CaF_2$; and
removing coated silicon substrate from the reactor.

28. The method of claim 27 wherein the organocalcium compound is bis-pentamethylcyclopentadienyl calcium.

29. The method of claim 28 wherein the gas which is a source of fluorine is $SiF_4$ or $NF_3$.

* * * * *

UNITED STATES PATENT AND TRADEMARK OFFICE
CERTIFICATE OF CORRECTION

PATENT NO.    :   5,026,575

DATED         :   June 25, 1991

INVENTOR(S)   :   Richard A. Jones et al.

It is certified that error appears in the above-identified patent and that said Letters Patent is hereby corrected as shown below:

In claim 5, column 5, line 49, delete the word "the".

Signed and Sealed this

Third Day of November, 1992

Attest:

DOUGLAS B. COMER

*Attesting Officer*    Acting Commissioner of Patents and Trademarks